(12) United States Patent  
Väänänen

(10) Patent No.: US 8,198,530 B2  
(45) Date of Patent: Jun. 12, 2012

(54) METHOD AND MEANS FOR A HIGH POWER SOLAR CELL

(76) Inventor: Mikko Väänänen, Helsinki (FI)

( * ) Notice: Subject to any disclaimer, the term of this patent is extended or adjusted under 35 U.S.C. 154(b) by 0 days.

(21) Appl. No.: 12/791,188

(22) Filed: Jun. 1, 2010

(65) Prior Publication Data

US 2010/0313934 A1 Dec. 16, 2010

(30) Foreign Application Priority Data

Jun. 10, 2009 (EP) .................................... 09162378

(51) Int. Cl.
*H02N 6/00* (2006.01)
*H01L 31/042* (2006.01)
*H01L 31/00* (2006.01)

(52) U.S. Cl. ........................ 136/257; 136/249

(58) Field of Classification Search .................. 136/249, 136/257
See application file for complete search history.

(56) References Cited

U.S. PATENT DOCUMENTS

| | | | |
|---|---|---|---|
| 4,188,238 A * | 2/1980 | Boling | 136/247 |
| 5,021,100 A * | 6/1991 | Ishihara et al. | 136/249 |
| 5,220,462 A | 6/1993 | Feldman, Jr. | |
| 6,320,117 B1 | 11/2001 | Campbell | |
| 6,689,949 B2 * | 2/2004 | Ortabasi | 136/246 |
| 2008/0251112 A1 | 10/2008 | Jenkins | |
| 2010/0132787 A1 | 6/2010 | Vaananen | |
| 2010/0186821 A1 | 7/2010 | Vaananen | |

FOREIGN PATENT DOCUMENTS

| | | |
|---|---|---|
| EP | 1724841 | 11/2006 |
| EP | 2226852 | 9/2010 |
| FI | 20070264 | 10/2008 |
| JP | 09162435 | 6/1997 |
| JP | 2003101059 | 4/2003 |
| WO | 2008145176 | 12/2008 |

OTHER PUBLICATIONS

Platz, R et al., "Improved Micromorph Tandem Cell Performance Through Enhanced Top Cell Currents", 26th PVSC, Sep. 30-Oct. 3, 1997, pp. 691-694, XP10267879.
Preuss, P., "An Unexpected Discovery Could Yield a Full Spectrum Solar Cell", Research News, Lawrence Berkeley National Laboratory, Nov. 18, 2002, 5 pages-cited in specification.
Markvart, T., "Solar Electricity", 2nd Edition; pp. 24-75; John Wiley & Sons, LTD., ISBN 0-471-98852-9-cited in specification, May 12, 2000.
Fischer, D. et al., "The "Micromorph" Solar Cell: Extending A-SI:H Technology Towards Thin Film Crystalline Silicon", 25th PVSC, May 1996, pp. 1053-1056, XP-10208332A.

* cited by examiner

*Primary Examiner* — Jennifer Michener
*Assistant Examiner* — Eli Mekhlin
(74) *Attorney, Agent, or Firm* — Young & Thompson

(57) ABSTRACT

In methods and apparatus for improving the power generated, and thus efficiency of solar cells, a double or triple junction tandem solar cell that has one or two photon filters of the invention in between the solar cell layers, respectively. The photon filter is arranged to reflect photons with wavelength shorter than $\lambda_x$ and arranged to be transparent to photons of wavelength longer than $\lambda_x$ by focussing the lower energy photons out of small area apertures on the other side of the photon filter and arranging the other side of the photon filter to reflect at least some of the photons of wavelength longer than $\lambda_x$. By using the photon filters of the invention in between the solar cell layers, photons can be trapped between filters to solar cell layers at an energy at which the quantum efficiency of the solar cell layer is the best.

14 Claims, 8 Drawing Sheets

METHOD AND MEANS FOR A HIGH POWER SOLAR CELL

TECHNICAL FIELD OF INVENTION

The invention relates to methods and means for improving the power generated and efficiency of solar cells.

BACKGROUND

Photovoltaic solar cells are the most recently discovered new method of producing energy, dating from the 1950's Soviet and US satellite power systems. Photovoltaic solar cells produce electricity with very low environmental impact, and are because of this desired by the public. The problem with present photovoltaic solar cells is that they do not produce enough energy for their cost and/or surface area to make them economically viable.

Therefore many technologies have been suggested to improve the efficiency of solar cells. EP 1724841 A1 describes a multilayer solar cell, wherein plural solar cell modules are incorporated and integrally laminated, so that different sensitivity wavelength bands are so that the shorter the centre wavelength in the sensitivity wavelength band is, the more near the module is located to the incidental side of sunlight. This document is cited here as reference. It is currently not known, which are all the factors that cause a shortcoming in the efficiency of the multilayer solar cell. However, based on the studies of the applicant, the general tandem solar cell is hampered the most by the photon-phonon processes that take place outside the band of maximum quantum efficiency of the solar cell, i.e. this is where in frequency space the cell generates a lot of heat. Individual factors pertaining to the disadvantages are also listed in the columns 1 and 2 of U.S. Pat. No. 6,689,949, which is cited here as reference. U.S. Pat. No. 6,689,949 discloses a photovoltaic reflective cavity with several solar cells in the cavity. The solar cells inside the cavity are under filters that filter the light so that the incoming photon flux is more appropriate for the quantum efficiency of the solar cell, i.e. more appropriate for its response or detector response.

NASA and JPL (Jet Propulsion Laboratory) have also proposed an alternative technique, called "Rainbow" where beam splitters and concentrators are used to split the solar spectrum into different bands and focus the different bands of light to different discrete solar cells that can handle the splitted and focused spectrum the best. This scheme requires a very complicated optical arrangement, and has not materialised to anything practical so far.

U.S. Pat. No. 5,021,100 discloses a tandem solar cell that has a reflective film between the first and the second solar cell (incident cell on sunlight side in this publication), where the reflective film is supposed to reflect high energy photons to the second solar cell and let low energy photons to the first solar cell (behind the second solar cell in this publication). This document is cited here as reference. U.S. Pat. No. 5,021, 100 has a serious problem in that the reflective film is a bidirectional, i.e. any reflected photons in the first solar cell will leak back to the second solar cell through the reflective film, and cause phonons and heat, as these photons cannot get absorbed in the second solar cell.

SUMMARY

The invention under study is directed towards a system and a method for effectively solving the problems of the prior art and realising a more powerful solar cell.

A more particular object of the invention is to present the aforementioned solar cell system, which has high capital cost in design, but ultimately a low production cost with large economies of scale. In order to achieve this, the invention introduces a tandem solar cell where each solar cell layer works with photons at energies where that solar cell layer has the highest quantum efficiency.

One aspect of the invention involves a solar cell with a photon reflector on the side opposite to the incident side of sunlight. The reflector is arranged to reflect photons with wavelengths suitable to the quantum efficiency function of the solar cell back to the solar cell.

In one aspect of the invention, there is a tandem solar cell with two solar cell layers. There is a photon filter between the two solar cells. The solar cell that is incident to sunlight is exposed, and this solar cell layer typically has the band gap that is of the higher energy. The solar photons enter this first solar cell, and the higher energy part of the solar spectrum is likely to get converted to photocurrent. Some high energy photons do not interact with the semiconductor, and just pass through or get dissociated into photons and phonons of lesser energy by the photon-phonon process. Those photons that are still of high enough energy to get converted to photocurrent in the first layer, i.e. where the energy of the photon (E) $E>E_{bg1}$ is greater than the band gap ($E_{bg1}$) of first solar cell, are reflected back into the first solar cell layer by the photon filter. These photons will get a second chance to get converted into photocurrent. Preferably the first solar cell layer is very thin and very pure, so that there is less time and space for non-absorbing processes, i.e. heat conversion by photons that do not match the band gap. The photons with energy $E<E_{bg1}$ band gap are now passed through by the filter to the second solar cell layer that has a lower band gap $E_{bg2}$. A large portion of these photons can now interact with the second band gap. The photon filter will collect the lower energy photons and then focus the lower energy photons into the second solar cell layers through very small apertures on the other side of the filter. These small apertures are permeable to photons. The rest of the area on the other side of the photon filter is also covered with a reflector material. This is because on the bottom of the second solar cell layer there is also a reflector that reflects photons capable of converting into photocurrent in the second solar cell layer back to the second solar cell layer. Some photons that get reflected from this reflector are still unabsorbed after having passed through the second solar cell layer the second time on their return journey. These photons are sent back by the reflector material surrounding the small apertures just said. The reflectors on the opposite side of the sunlight incident side of the photon filter and at the bottom of the tandem solar cell system trap the photons capable of producing photocurrent in the second solar cell layer, i.e. photons typically of $E>E_{bg2}$. These photons bounce back and forth until they get absorbed or dissociate into photons of energy less than $E_{bg2}$.

The entrapment of the photons into the second solar cell results from the first photon filter being unidirectional. I.e. apart from the very small possibility of leaked photons back through the small apertures, the majority of the photon population is bouncing between two reflectors in a second solar cell that has a band gap favourable for photoelectric absorption and current generation. The photon filter described above relies on a technique developed by the inventor, and named by the inventor, as spatiospectral modulation.

A unidirectional photon filter may also be realised in the above example by two reflective photon filters with an anti-reflective coating and/or coarsening between them in accordance with the invention. Also, the materials of the solar cells and photon filters may be selected so that the unidirectional filtration of photons is achieved based on the refractive indices of the materials in accordance with the invention. These photon filters in contrast suffer some losses in ideal unidirectionality in the form of leaking photons from stray angles.

In one aspect of an inventive embodiment the tandem solar cell comprises several solar cell layers, and in between two layers there is a photon filter. The photon filters are tuned so, that they will trap only those photons that are at an energy where the solar cell layer is working at a good quantum efficiency (QE), ideally close to 1. The rest of the photons are simply passed to the next layer by the photon filter. There can be indeed many layers that are preferably very thin, or otherwise designed so that there is minimal interaction between the solar cell and the photon population at energies where the quantum efficiency is NOT that good, i.e. far from unity.

By quantum efficiency we mean its general meaning as defined in Larousse Dictionary of Science and Technology: quantum efficiency (Phys): "Number of electrons released in a photocell per photon of incident radiation of specified wavelength". Inventor further points out that this parameter can be normalised to yield the typical 100-0% scale when necessary. The quantum efficiency is an extremely good measure of how good the photocell is in converting photons into electricity. The detector response or response is the quantum efficiency as a function of wavelength, i.e. it tells how the photocell responds to incoming photons at different energies.

In terms of the solar cell in this application high quantum efficiency (QE) is a QE that is higher than the QE's of other alternative solar cell layers at the same photon energy. In practical terms the band of spectrum that might be worth holding onto in a particular solar cell layer is when the QE exceeds 10%, i.e. the overall QE of present wholesale market solar cells. However, roughly 30-50% should be regarded as the threshold QE, if the tandem solar cell is going to economically replace oil and gas in the current market conditions. Photons at energies where the solar cell layer has a QE less than 30-50% should be moved to other solar cell layers that have higher QEs, as will be described later in the application. As for portable electronic devices, 30-50% could similarly be regarded as a good QE, but this should depend on device requirements in accordance with the invention. For example, a Nokia E71 mobile phone has an area of 72 cm$^2$ and a battery of 1.5 Ah, with a voltage of 3.7 V. If the inventive solar cell achieves an efficiency of 50% and covers the surface of the phone with an area of 72 cm$^2$, assuming a solar flux of 1000 W/m$^2$ this will mean that the battery will fully charge in approximately 1.5 hours of exposure according to the calculations of the applicant. Quite clearly, 1.5 hours of exposure over the battery life of roughly a week is beginning to be at the reach of the market, if it provides the added benefit of not having to use an electric grid charger most of the time.

Some or all of the aforementioned advantages of the invention are accrued in one embodiment where there can be many, for example a hundred solar cell layers of different band gaps separated by reflecting photon filters as just described. Typically a semiconductor junction can maintain high quantum efficiency only at a very narrow band. The further the departure from the optimum energy, the smaller the QE gets. In one embodiment of the invention there are a hundred solar cell layers that have high QE's at bands that are 10-20 nm wide in the wavelength space. By using these cells it is possible to sample the entire solar spectrum from 150 nm (UV) to 1500 nm (IR) with semiconductor junctions that operate at very high quantum efficiency. The photon filters are set so that the first solar cell layer will have photons of energy 150-160 nm in wavelength space, the second 160-170 nm, the third 170-190 nm, and so on. Naturally the first solar cell layer only needs to be efficient in the 150 nm-160 nm band, which is easier to achieve. In addition, it should disturb the photons with wavelengths longer than 160 nm as minimally as possible. These photons will pass to the layers that follow with each being trapped as explained above into their own 10-20 nm bands with a solar cell layer that is at its best efficiency at that band.

A tandem solar cell in accordance with the invention comprises at least two layers of solar cells, the first and the second layer and is characterised in that,
   a first photon filter is arranged in between the first solar cell layer and the second solar cell layer,
   the solar cell is arranged with the photon filter on the side opposite to the incident side of sunlight,
   the photon filter is arranged to reflect photons of certain energy back into the first solar cell,
   the photon filter is arranged to be transparent to photons of other energies not arranged to be reflected, and these photons are arranged to enter the second solar cell.

The above photon filter is also arranged to reflect back the returning photons from the second solar cell, and prevent them from entering the first solar cell, thereby realising unidirectionality of the photon filter in accordance with the invention. In some embodiments there is a reflector at the bottom of the second solar cell to realise entrapment of photons of suitable energy to the second solar cell layer.

A method of producing the aforementioned tandem solar cell is in accordance with the invention.

A photon filter in accordance with the invention is arranged to reflect photons with wavelengths shorter than $\lambda_x$ from its first side and arranged to be transparent to photons of wavelengths longer than $\lambda_x$ by focussing the said longer wavelength photons out of small area apertures on the other side opposite to the first side of the photon filter and the other side of the photon filter is arranged to reflect at least some of the said photons of wavelength longer than $\lambda_x$.

A tandem solar cell, comprises at least two solar cell layers in accordance with the invention and is characterised in that the said tandem solar cell is arranged to transport an incoming photon to the solar cell layer that has the highest quantum efficiency (QE) at the energy of the said incoming photon in comparison to the other said solar cell layers in the tandem solar cell.

A tandem solar cell in accordance with the invention comprises at least two layers of solar cells, the first and the second layer and is characterised in that,
   a first photon filter is arranged in between the first solar cell layer and the second solar cell layer,
   an antireflection coating layer is arranged between the first photon filter and the second solar cell layer,
   a second photon filter is arranged between the said antireflection coating and the second solar cell layer.

A tandem solar cell in accordance with the invention comprises at least two layers of solar cells, the first solar cell layer and the second solar cell layer and is characterised in that, at least one unidirectional photon filter is arranged between the first and the second solar cell layers.

"unidirectional photon filter" in the context of this application means a photon filter which is arranged to reflect a group of photons, and arranged to pass a group of photons through one way, but also arranged to NOT allow passed photons to return back again through the said photon filter. While such an ideal photon filter is difficult if not impossible to produce in real physical life, the invention presents four unidirectional photon filters, the spatiospectrally modulating filter, the antireflective coating filter, the coarse antireflective filter and/or the refractive index filter. These filters are construed as unidirectional in this application, while acknowledging the practical bounds of these filters filtering photons unidirectionally.

A tandem solar cell in accordance with the invention comprises at least two layers of solar cells, the first solar cell layer with a band gap energy of $E_{bg}$ and the second solar cell layer and is characterised in that, the second solar cell has a lower refractive index than the first solar cell layer at photon energies equal or higher than $E_{bg}$.

In the above tandem solar cell the second solar cell typically also has a higher refractive index than the first solar cell layer at photon energies lower than $E_{bg}$ in accordance with the invention, and a band gap lower than $E_{bg}$.

A tandem solar cell in accordance with the invention comprises at least two layers of solar cells, the first solar cell layer and the second solar cell layer and is characterised in that, at least one said solar cell layer is arranged to have its quantum efficiency (QE) vs. wavelength and its refractive index vs. wavelength functions to reach peak and/or high values at same wavelengths.

A portable electronic device in accordance with the invention comprises at least one solar cell and is characterised in that, said portable electronic device features at least one piezoelectric crystal and/or at least one mechanical means arranged to generate electricity from mechanical movement of said portable electronic device. The said solar cell is preferably a tandem solar cell, most preferably the tandem solar cell described in this application, but in some embodiments it may also be a conventional solar cell.

In addition and with reference to the aforementioned advantage accruing embodiments, the best mode of the invention at present is considered to be a double or triple junction tandem solar cell that has one or two photon filters of the invention in between the solar cell layers, respectively. This tandem solar cell is used to power a self charging mobile phone, which may have a mechanical/kinetic electricity generator such as piezoelectric crystals or a pendulum/spring system found in e.g. watches as a backup for charging at times when the mobile phone is concealed from light, e.g. in the pocket of the user.

BRIEF DESCRIPTION OF THE DRAWINGS

In the following the invention will be described in greater detail with reference to exemplary embodiments in accordance with the accompanying drawings, in which FIG. 1 demonstrates an embodiment of the inventive unidirectional photon filter 10 as a block diagram.

Some of the embodiments are described in the dependent claims.

DETAILED DESCRIPTION OF EMBODIMENTS

Figure 1:
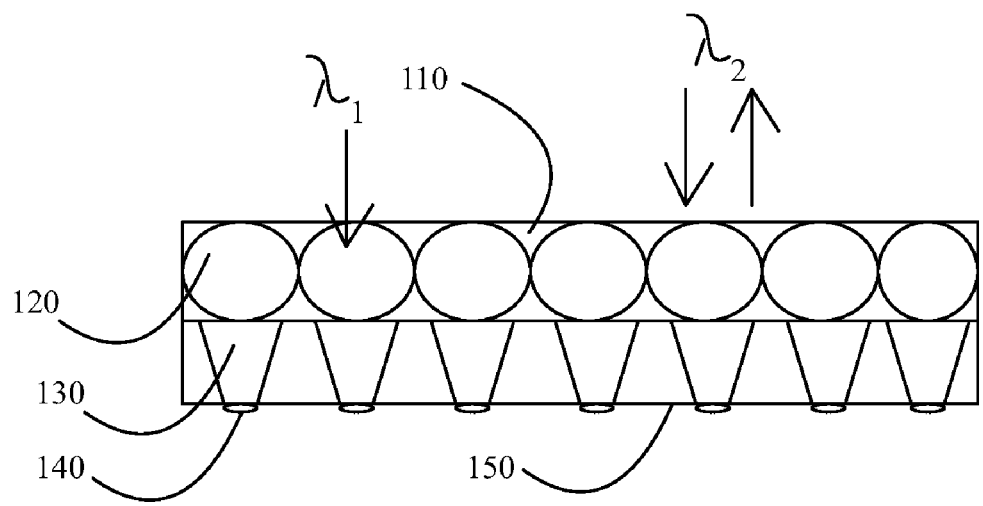

FIG. 1 demonstrates an exemplary embodiment of the photon filter 100 in isolation that is to be placed between two solar cell layers in a tandem solar cell. The incident sunlight side is assumed up in this figure. Photons with $\lambda_2$ have higher energy than photons with $\lambda_1$ i.e. $\lambda_2 < \lambda_1$ in some embodiments, but it is also possible that the filter 100 is configured in reverse, i.e. it reflects low E photons whilst letting high E photons pass in accordance with the invention. The photon filter 100 has a reflecting cover 110 on the sun incident side. The reflecting cover 110 may be a Rugate filter, or any other optical band pass filter in accordance with the invention. Underneath the reflecting cover are at least one focusing means for the photons that are not reflected, i.e. the photons that pass through the reflecting cover 110. These focusing means that are typically lenses of any shape, can be and are shown circular in the figure, focus the photon population into a narrowing horn 130. This horn may be covered with reflecting material from the inside so that the photons that pass through it are directed out of at least one small aperture 140. In some embodiments there may be no horn, but still in these embodiments the photons are focused to a small spot when they exit the filter 100. On the opposite side to incident sunlight most of the area is occupied by another photon reflector 150. The small apertures are embedded into the reflector 150 and occupy only a fraction of the area of the other side of the photon filter 100. The reflector 150 is designed to reflect back the photons that entered the solar cell underneath from the at least one aperture 140, but did not interact with the solar cell layer, and got instead reflected by another filter on the other side of the second solar cell layer. In some embodiments the ratio of the area of reflector 150 to apertures 140 is made as big as possible in accordance with the invention. This is because the smaller the area of the apertures is in comparison to reflector 150, the smaller the probability for a reflecting photon to leak back to the first solar cell 200, and thereby violate unidirectionality of the filter.

The effect of the spatial modulation that allows the reflection by the reflector 150 might be realised by other means besides focusing the entry into small apertures in some embodiments. For example a unidirectionally transparent filter could be used in some embodiments to replace the focusing means 120 and apertures 140 in accordance with the invention. In this embodiment it is important that the transparency is indeed unidirectional, the filter 100 must not let those photons filtered through to the next layer to return to the first layer 200 in accordance with the invention.

The filter 100, 110, 150 can be any band pass, short pass, long pass and/or notch filter, a Rugate filter and/or a discrete layer stack filter in accordance with the invention.

While the solar cell layers can be only a few nanometers thick in some embodiments of the invention, it is also possible that the photon filter is very thin, just a few nanometers in thickness in accordance with the invention.

In some embodiments at least one aperture 140 contains a diffracting or dispersing element that spreads the photons from the apertures effectively into the second solar cell.

The at least one focusing means 120, horn 130, aperture 140, reflector 110, and/or 150 can be made from any material in accordance with the invention. Optical filter and/or reflector components 110, 130, 150 and/or focusing elements 120, 121, 140, 141 can be made of any of the following in accordance with the invention: reflective foil, such as metal foil, ultraviolet/visible/infra red mirror such as aluminium or gold mirror or said mirror or mirror foil with opaque, vacuum-deposited metallic coatings on low-expansion glass substrates, Aluminum/MgF2—mirror, Aluminum/SiO—mirror, Aluminum/dielectric—mirror, Protected Gold—mirror and/or normal mirror and/or any Rugate filter material and/or dielectric stack material and/or any band pass, short pass, long pass and/or notch filter. The choice of the reflective and/or focusing material should be based on the reflectance—wavelength function of the material amongst other practical things such as cost and availability in some embodiments of the invention. In some embodiments it is preferred for the reflection and/or focusing to be efficient up to Far-IR, or in any case to the wavelength that equates with the smallest band gap in the solar cell layers. The focusing structure can also be replaced with a filter that is a: Rugate filter and/or dielectric stack filter or a filter that combines the said two technologies to realise a unidirectional filter. This could be realised so that total internal reflection is practically always present at the outside face 150 for photons that have passed through the filter preventing them from returning, because of the angle and energy distribution of the photons after the filter 100. However, when the photons are coming from the other side (110, i.e. those that were not reflected), these photons are aligned to penetrate through face 150 from the inside.

It should be noted that the embodiment 10 can be freely combined and permuted with embodiments 20, 21, 30, 40 and 50 later in the text in accordance with the invention.

FIGS. 2A, 2B, 2C, and 2D display embodiments of the invention where the two solar cell layers are combined with the photon filters of the invention to realise an inventive tandem solar cell 20. The incident sunlight is at the top of the figures as shown. The first solar cell layer 200 or any subsequent solar cell layer mentioned in this application can be typically made of or may contain Si (Silicon), polycrystalline silicon, thin-film silicon, amorphous silicon, Ge (Germanium), GaAs (Gallium Arsenide), GaAlAs (Gallium Aluminum Arsenide), GaAlAs/GaAs, GaP (Gallium Phosphide), InGaAs (Indium Gallium Arsenic), InP (Indium phosphide), InGaAs/InP, GaAsP (Gallium Arsenic Phosphide) GaAsP/GaP, CdS (Cadmium Sulphide), CIS (Copper Indium Diselenide), CdTe (Cadmium Telluride), InGaP (Indium Gallium Phosphide) AlGaInP (Aluminium Gallium Indium Phosphide), InSb (Indium Antimonide), CIGS (Copper Indium/Gallium diselenide) and/or InGaN (Indium Gallium Nitride) in accordance with the invention. Likewise the first solar cell layer 200 or any subsequent solar cell layer mentioned in this application may feature any element or alloy combination, or any material capable of photoelectric effect described in the publications FI20070264, FI20070743, FI20070801, EP 09154530.1, EP 1724 841 A1, Josuke Nakata, "Multilayer Solar Cell", U.S. Pat. No. 6,320,117, James P. Campbell et al., "Transparent solar cell and method of fabrication", Solar Electricity, Thomas Markvart, 2$^{nd}$ Edition, ISBN 0-471-98852-9 and "An unexpected discovery could yield a full spectrum solar cell, Paul Preuss, Research News, Lawrence Berkeley National Laboratory, which publications are all incorporated into this application by reference in accordance with the invention.

In the figures the incident photons hit the solar cell p-n junction and excite electrons, thus resulting in photocurrent that can be used to power a load. The first photon filter 100 is arranged in between the solar cell layers 200 and 201, and the solar cell 200 is arranged with the photon filter 100 on the side opposite to the incident side of sunlight. The photon filter 100 is arranged to reflect photons back into the first solar cell 200 with energies that are at energies where the first solar cell 200 has high quantum efficiency ($\lambda_2$ photons). On the other hand the photon filter 100 is arranged to be transparent to photons of other energies or wavelengths $\lambda_1$ and these photons are arranged to enter the second solar cell (201). The photon filter 100 does not allow the $\lambda_1$ photons to return back to the first solar cell layer, thereby realising unidirectionality. Therefore the photons that have an energy/wavelength $\lambda_2$ that could get converted to photocurrent in first solar cell layer 200 are reflected back to the first solar cell layer 200 by e.g. the reflector 110, and those that can't are arranged to be transported to another solar cell layer, such as second solar cell layer 201, where they remain entrapped if at energy higher than the energy band gap of second solar cell layer 201.

In some embodiments the solar cell layers are very thin to minimise the scattering cross-section of unwanted photon interactions, i.e. those that happen at energies where the quantum efficiency of the solar cell layer is poor. These interactions heat up the solar cell. In some embodiments the sunlight incident side of solar cell 200 is covered by a semi-permeable film, or an anti-reflection coating 167 shown in FIG. 2B. In some embodiments there is a film on the sunlight incident side of solar cell 200 that only lets solar photons in, but does not allow them to get out. In some embodiments of the invention this antireflection effect is obtained by coarsening the Sun incident surface of the first solar cell 200.

In some embodiments of the invention incident sunlight is focused on a section of the first solar cell 200, and the resulting beam is arranged to be dispersed by reflector 110 after it has passed through the first solar cell layer 200, i.e. the reflector might also have different shapes in some embodiments of the invention. This is shown in more detail in FIG. 2C, where the lens 190 focuses the photons to the depletion region, and the reflector has a dispersing means 195 for dispersing photons into the depletion region and further onto reflectors 180, 181. In this embodiment especially, some sections of the Sun incident surface of the first solar cell 200 are arranged with a photon reflector 180, 181 in accordance with the invention, especially those sections that no longer have many incident photons on them, as the incident photons have been focused to other sections of the first solar cell 200. The reflectors 180, 181 are typically for the whole solar band, but can also be specifically designed for $\lambda_2$ photons.

The reflector filter 110 is typically a Rugate filter in some embodiments but can be any other band pass photon filter in accordance with the invention. The filter 110 splits the photons into two populations: the reflected photons $\lambda_2$ and the photons passed through $\lambda_1$. In some embodiments of the invention there is a cut-off frequency/wavelength/energy $\lambda_x$ that splits the populations, in the case of the first photon filter let us name the cut-off $\lambda_{x100}$.

Figure 2A:
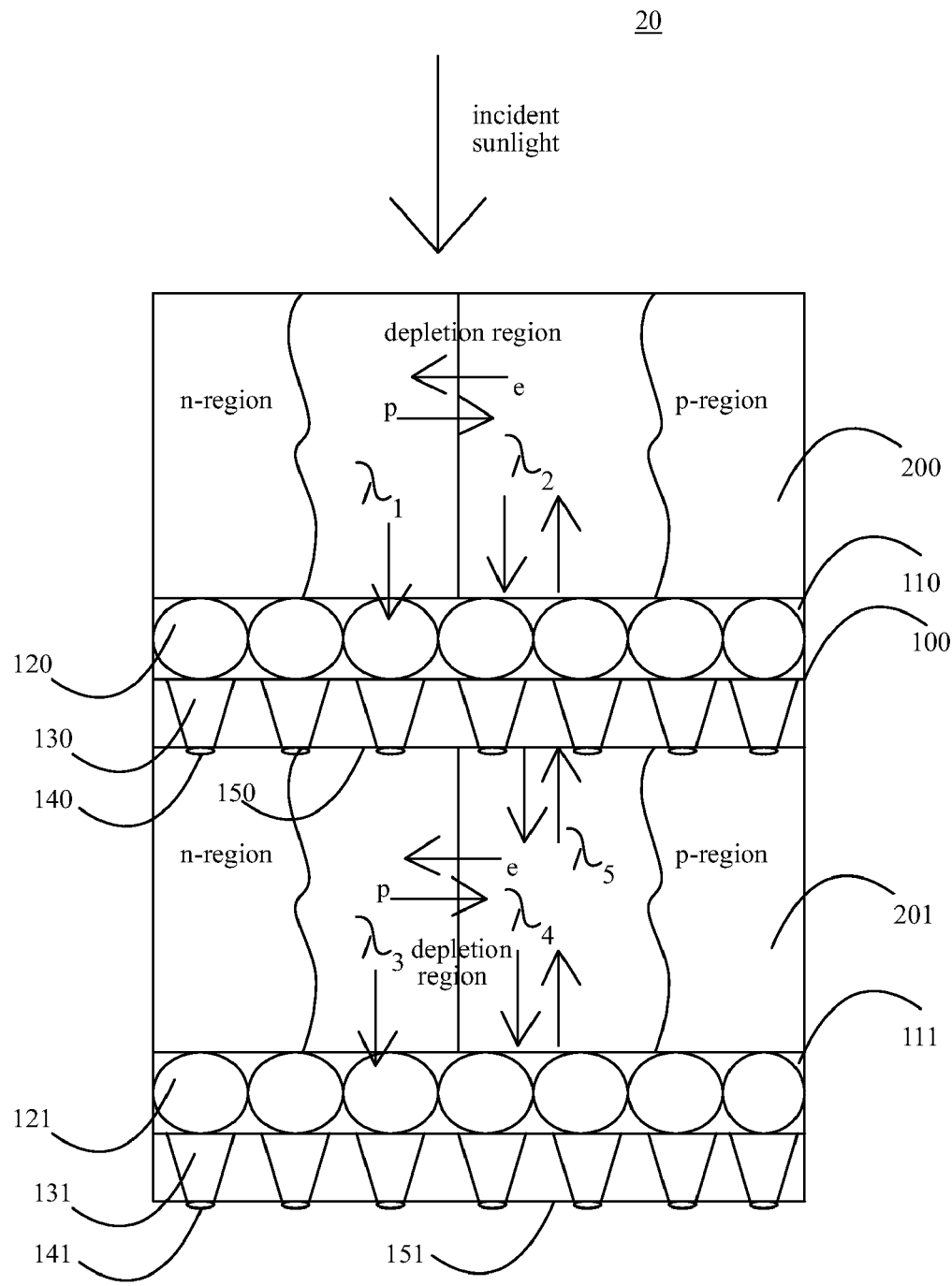
FIG. 2A demonstrates an embodiment of an inventive tandem solar cell with two solar cell layers as a block diagram 20.

In FIG. 2A the second solar cell 201 is arranged with a photon filter on the side opposite to the incident side of sunlight 111 and also on the sunlight incident side 150. The photon filter 100 is arranged to focus the photons of other energies that did not get reflected by the reflector 110, and the said photons enter through small apertures 140 from the photon filter 100 side opposite to the incident side of sunlight. As these photons enter the second solar cell layer, they are again subject to the aforementioned procedure, but with a different band gap and cut-off wavelengths. The $\lambda_1$ photons are interacting with the band gap of second solar cell layer 201, i.e. at least those photons that do have the energy to do so.

It could be summarised that the photon filter of the invention conducts a spatiospectral modulation on the solar spectrum, i.e. it alters the photon signal/population in the spatial (focus on small apertures) space as well as frequency space (filtering) in FIG. 2A.

In some embodiments the second solar cell 201 is arranged with a second photon filter 101 on the side opposite to the incident side of sunlight. The second photon filter 101 splits the $\lambda_1$ photon population into two. Let us name the cut-off wavelength here as $\lambda_{x111}$. The second photon filter 101 is arranged to reflect photons back into the second solar cell 201 with energies that are energies where the second solar cell 201 has high quantum efficiency. These photons are marked with $\lambda_4$ in the FIGS. 2A, 2B, 2C, 2D. The first photon filter 100 is also arranged to reflect photons back into the second solar cell 201 with energies that are energies where the second solar cell 201 has high quantum efficiency, with a photon reflector 150 that is on the side opposite to the incident side of sunlight in the first photon filter 100 in some embodiments. These photons are marked with $\lambda_5$ in the FIG. 2A. In some embodiments the wavelengths are the same i.e. these photons are marked with $\lambda_4=\lambda_5$, but they may also be different in accordance with the invention in other embodiments. In some embodiments the photon filters 100, 101 are arranged to entrap photons into the second solar cell that are at energies where the second solar cell 201 has high quantum efficiency. The photons at these energies will be bouncing between the filters 100, 101 until they get absorbed by the second solar cell layer 201, or go through a photon-phonon process that allows them to escape into the photon population with energy/wavelength $\lambda_3$ and exit through filter 101. In other words, the second photon filter 101 is arranged to be transparent to photons that are not at energies where the second solar cell 201 has a high quantum efficiency, and these said transparent photons are arranged to enter a third solar cell 202 (not shown here), or exit the tandem solar cell system.

A method of producing the aforementioned solar cell is also in accordance with the invention. In some embodiments of the invention at least one of the solar cell layers and/or photon filters is produced, manufactured and/or grown by lithography, molecular beam epitaxy (MBE) metalorganic vapour phase epitaxy (MOVPE), Czochralski (CZ) silicon crystal growth method, Edge-define film-fed growth (EFG) method, Float-zone silicon crystal growth method, Ingot growth method and/or Liquid phase epitaxy, (LPE). Any fabrication method described in the references FI20070264, An active solar cell and method of manufacture, FI20070743 Thermodynamically shielded solar cell, FI20070801 Method and means for designing a solar cell, EP 09154530.1 Low cost solar cell, EP 1724 841 A1, Josuke Nakata, "Multilayer Solar Cell", U.S. Pat. No. 6,320,117, James P. Campbell et al., "Transparent solar cell and method of fabrication", Solar Electricity, Thomas Markvart, $2^{nd}$ Edition, ISBN 0-471-98852-9 and "An unexpected discovery could yield a full spectrum solar cell, Paul Preuss, Research News, Lawrence Berkeley National Laboratory, U.S. Pat. No. 6,320,117, James P. Campbell et al., "Transparent solar cell and method of fabrication", U.S. Pat. No. 6,689,949, Ugur Ortabasi, Concentrating photovoltaic cavity converters for extreme solar-to-electric conversion efficiencies, US 2008/0251112 A1, David g. Jenkins, Concentrating photovoltaic kaleidoscope and method, can be applied to produce a solar cell in accordance with the invention.

Optical filter components; reflector elements 110, 111, 130, 131, 150, 151 and/or focusing elements 120, 121, 140, 141 can made of any of the following in accordance with the invention: reflective foil, such as metal foil, ultraviolet/visible/infra red mirror such as aluminium or gold mirror or said mirror or mirror foil with opaque, vacuum-deposited metallic coatings on low-expansion glass substrates, Aluminum/ MgF2-mirror, Aluminum/SiO-mirror, Aluminum/dielectric-mirror, Protected Gold-mirror and/or normal mirror and/or any Rugate filter material and/or dielectric stack material and/or any band pass, short pass, long pass and/or notch filter. The choice of the reflective and/or focusing material should be based on the reflectance-wavelength function of the material amongst other practical things such as cost and availability in some embodiments of the invention. In some embodiments it is preferred for the reflection and/or focusing to be efficient up to Far-IR, or in any case to the wavelength that equates with the smallest band gap in the solar cell layers.

It should be noted that the embodiment 20 can be freely combined and permuted with embodiments 10, 21, 22, 23, 30, 40 and/or 50 earlier and later in the text in accordance with the invention.

Figure 2B:
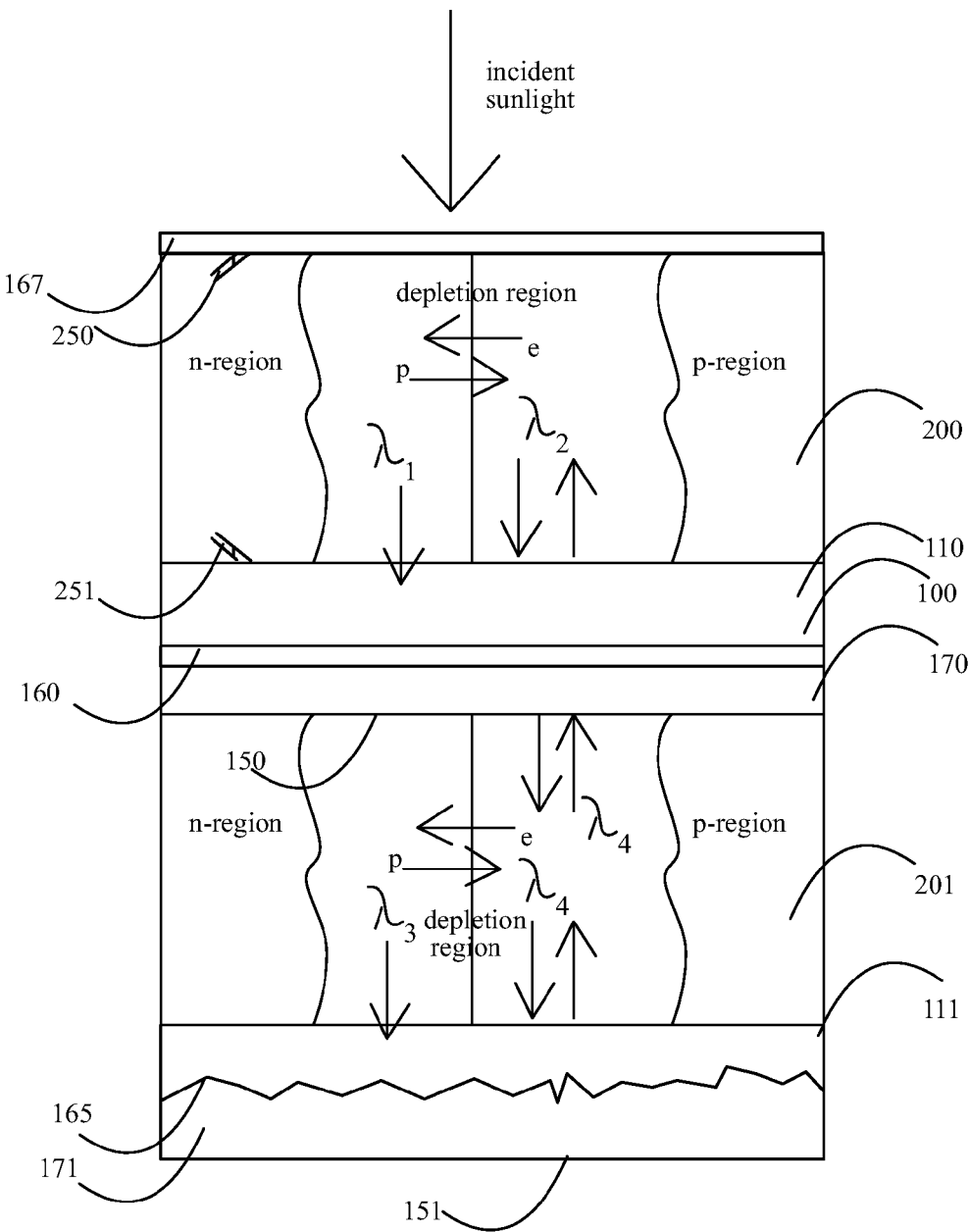
FIG. 2B demonstrates an embodiment of an inventive tandem solar cell with two solar cell layers with alternative unidirectional photon filters as a block diagram 21.

FIG. 2B presents an alternative inventive photon filter arrangement for a tandem solar cell of the invention. Sunlight enters the first solar cell 200 of the tandem solar cell as explained before. The filter 110 is preferably adjusted to reflect high energy and short wavelength $\lambda_2$ photons back to the solar cell 200, and the first solar cell 200 is typically arranged with a high energy band gap and a response or quantum efficiency (QE) function that has a high efficiency at these higher energies. The filter 100 is arranged to pass lower energy photons with longer wavelengths $\lambda_1$ through. These $\lambda_1$ photons are arranged to enter the second solar cell 201, which has a response and a band gap that has higher quantum efficiency at the energies of these photons. However, the second solar cell 201 needs a photon filter 170 at the sunlight incident side, and the $\lambda_1$ photons need to be arranged to pass through it to ensure photon entrapment in second solar cell 201. To do the aforementioned, an antireflective coating 160 is arranged between the two filters 110 and 170. The filter 170 is arranged to reflect $\lambda_1$ photons on the side incident to the second solar cell 201 back to the second solar cell 201, so these photons need to be carefully inserted through the filter 170 to the second solar cell 201, so that the filter 170 does not reflect them back to the first solar cell 200, because $\lambda_1$ photons are not wanted there, as they cannot convert to current in accordance with the invention.

The antireflective coating 160 is typically a quarter wavelength layer with the refraction index of $\sqrt{(n_{110}n_{170})}$, where $n_{110}$ is the refractive index of filter 110, and $n_{170}$ is the refractive index of filter 170. As said the antireflective coating typically has a thickness of $(\frac{1}{4})*\lambda_1$ or similar. It should be noted that as the optimum thickness varies as a function of the wavelength, the optimum thickness for the antireflective coating may depart quite significantly from $\lambda_1$ in some embodiments of the invention, depending on the secondary photon spectrum that emerges through the photon filter 110.

In some embodiments of the invention the antireflective coating 160 contains several layers of the aforementioned quarter wavelength layer, typically based on different wavelengths to increase the spectral range of the antireflective coating 160. In some embodiments of the invention the refractive index may deviate from $\sqrt{(n_{110}n_{170})}$, preferably to accommodate other design requirements in accordance with the invention. The antireflective coating 160 is designed to achieve a smooth transition of $\lambda_1$ photons into the second solar cell layer 201, and the fact that there is no antireflective coating between filter 170 and the second solar cell layer 201 is designed to prevent any photons now in the second solar cell layer 201 from returning back through the filter 170 towards the first solar cell layer 200.

In one embodiment of the invention, the refractive indices of the materials are adjusted so that there is total internal reflection between filter 170 and second solar cell layer 201. In this embodiment preferably the filter 170 will have a low index of refraction, whereas the second solar cell layer 201 should have a high index of refraction. This would be preferable in accordance with the invention and in view of the critical angle law $\theta=\arcsin(n_{to}/n_{from})$, where $n_{to}$ is the refractive index of the destination material to which the photon is headed to, and $n_{from}$ is the refractive index of the material from which the photon attempts to enter the destination material. So if the filter 170 has a low index of refraction in comparison to second solar cell layer 201,→for a photon going from filter 170 to second solar cell layer 201 arcsin (high)→not defined, no total internal reflection, even at grazing angles, the photons will pass through. Coming back however, arcsin (low)→total internal reflection will occur even for nearly perpendicularly incident returning photons. In some specific interfaces the refractive indices of the materials may be used to realise preferred distribution of photons in accordance with the invention.

In fact, in some embodiments of the invention there is no need for the antireflective coating 160, when the refractive indices of the materials are adjusted properly.

Figure 2C:
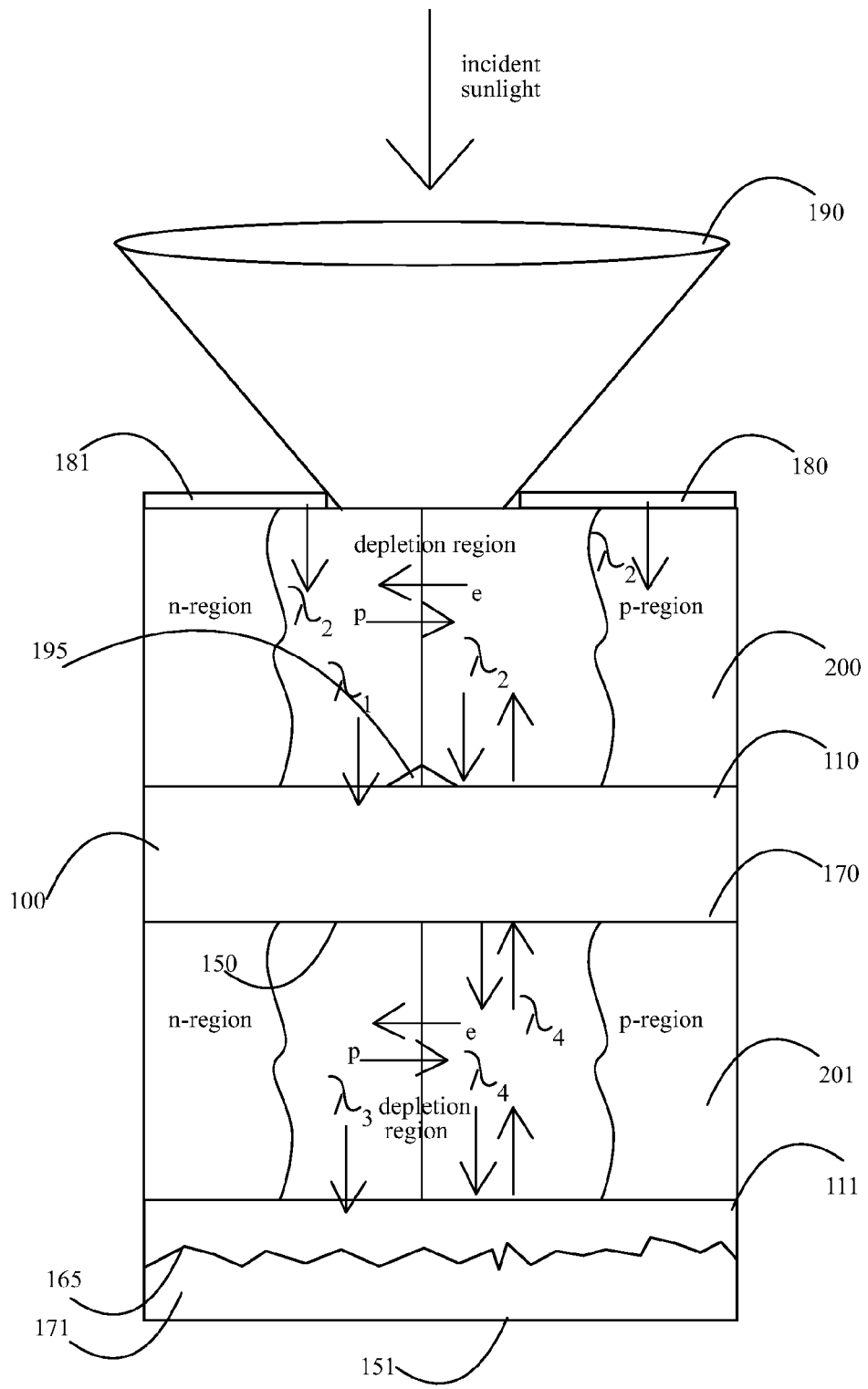
FIG. 2C demonstrates an embodiment of an inventive tandem solar cell with two solar cell layers with alternative unidirectional photon filters as a block diagram 22 and a focusing means on the sunlight incident side.
Figure 2D:
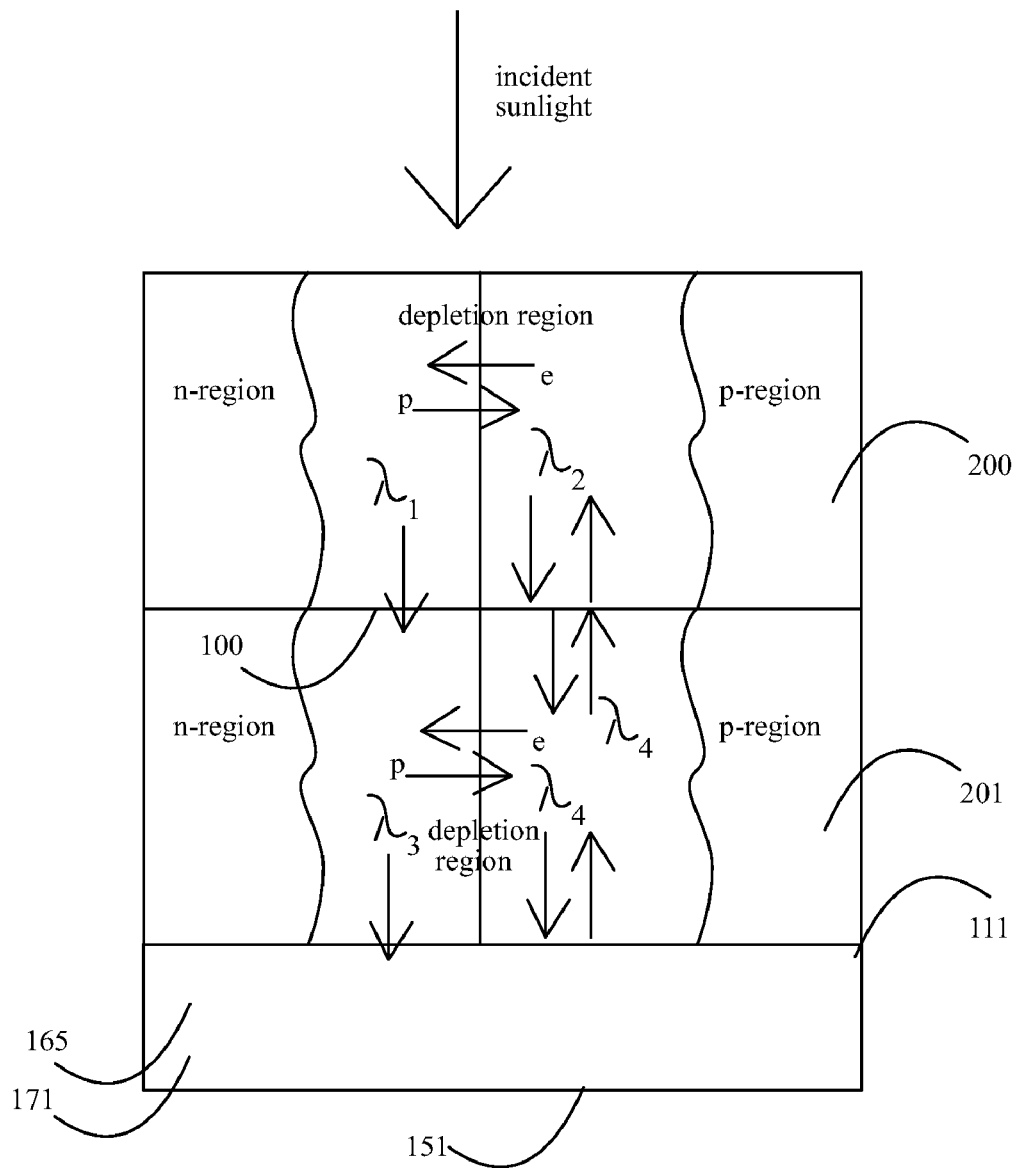
FIG. 2D demonstrates an embodiment of an inventive tandem solar cell with two solar cell layers with alternative photon filtration realised by the selection of refractive indices for solar cell materials, as a block diagram 23.

In fact, in one embodiment there is no filter between the two solar cell layers 200, 201, rather the refractive indices of the materials at certain wavelengths are chosen so that photon entrapment results to the right solar cell layer at the right photon energy, and the interface between the two solar cell layers 200, 201 realises the unidirectional photon filter of the invention. This embodiment is shown in FIG. 2D. For example in one embodiment the second solar cell 201 has a high relative refractive index at energies below the energy band gap of the first solar cell 200, and a low relative refractive index at energies higher than the energy band gap of the first solar cell 200. With this choice of refractive indices, the high energy photons more suitable for the band gap of the first solar cell layer 200 get reflected at the interface of the second solar cell 201 back into the first solar cell 200.

Furthermore the lower energy photons more suitable for the band gap of the second solar cell 201 will now transmit through the interface. Even further, the photons that were transmitted into the second solar cell 201 are typically reflected back from a reflector at the bottom of the second solar cell 201. When these photons return back to the interface, the likelihood of total internal reflection is very high, because for the returning reflected photon, the interface has a high relative $n_{from}$ and a low relative $n_{to}$. Consequently, the returning photons are trapped into the second solar cell layer 201, unless they can pass onto a further third solar cell layer or exit through a similar refractive index interface or some of the other unidirectional filter options mentioned before. Furthermore, from this follows the disruptive invention that indeed in a tandem solar cell the refractive index wavelength function of a solar cell material should peak in the proximity of the band gap of the said solar cell material, and even more preferably have a low refractive index at energies far away from its band gap. Consequently a solar cell layer in a tandem solar cell should have a QE (quantum efficiency) vs. wavelength function that peaks with the refractive index vs. wavelength function, i.e. the high refractive index would ideally be associated with a high QE in a solar cell layer of the tandem solar cell of the invention.

Quite clearly it is in accordance with the invention to have more than one photon filters that are realised by choosing the refractive indices of the solar cell layer materials as explained above. For example a tandem solar cell with four solar cell layers may have two interfaces that are realised by choosing individual solar cell layers with appropriate refractive indices, and one interface that has some of the more elaborate unidirectional photon filter arrangement, such as spatiospectral modulation, antireflective coating and/or coarsened interface as explained before. It is of course also in accordance with the invention to have a single filter layer between the solar cell layers, as is shown in FIG. 2C.

The $\lambda_1$ photons then enter the second solar cell 201 through the filter 170 and $\lambda_4$ photons are arranged to be entrapped into the second solar cell 201, whereas $\lambda_3$ photons are arranged to pass through the filter 111 and out of the second solar cell 201. In consistency with what has been said before, the second solar cell 201 is typically arranged to have high quantum efficiency at energies of photons $\lambda_4$, which are typically the high energy photons of the photon population $\lambda_1$. Typically in accordance with the invention, the photons $\lambda_3$ have a lower energy and longer wavelength at which wavelength the second solar cell 201 is no longer efficient. $\lambda_3$ photons are therefore arranged to exit the second solar cell, and possibly enter a third solar cell (not shown), or simply exit the tandem solar cell. $\lambda_3$ photons typically transmit through the filter 111 in accordance with the invention and reach an antireflective interface 165, because the $\lambda_3$ photons are not wanted in the second solar cell as explained before.

In this particular case the antireflective interface 165 has been achieved by coarsening the interface between the two photon filters 111 and 171. The coarsened interface 165 is arranged to prevent total internal reflection and reflection in general by the photon filter 171. This is because in a coarsened interface the photons cannot escape the interface with a single reflection at an angle of total internal reflection, instead they will meet the photon filter 171 at an incidence angle somewhere in the coarse interface that will typically allow transmission.

Quite clearly the antireflective coating 160 and/or antireflective interface 165 of FIG. 2B can be used to substitute the spatiospectrally modulating optical filter arrangements (120, 130, 140) of FIG. 2A in some embodiments of the invention.

Quite clearly the tandem solar cell of the invention may feature any number of solar cells with any number of filter arrangements and any type of filter arrangements which may include antireflective coating 160, antireflective interface 165, suitably selected refractive indices $n_{to}$, $n_{from}$ and/or spatiospectral modulation in any combination and/or permutation in accordance with the invention. It should be noted that any interface can be coarsened in accordance with the invention to increase antireflection properties, for example the interface arranged to filter photons based on selected refractive indices as explained before can also be coarsened in accordance with the invention.

For clarity, it should be noted that the tandem solar cell has the depletion region interface in parallel to incident sunlight in FIGS. 2A, 2B, 2C and 2D. Quite clearly the depletion region interface may also be perpendicular or in fact in any angle to the incident sunlight, as the main point is to get the photons into the photoelectrically active first solar cell 200 in accordance with the invention. In some embodiments of the invention the depletion region interface between the p-region and the n-region is arranged perpendicular to incident sunlight, but any positioning is possible in accordance with the invention. The electrical contacts that collect the generated photocurrent are shown in FIG. 2B as front contact 250 and rear contact 251, but clearly they can be positioned to accommodate different configurations in accordance with the invention. The electrical contacts are typically hidden to minimise shading losses, for example by Angled Buried Contacts, as is shown for the front contact 250, where the contact is actually at an angle buried under the surface, and thereby does not cause a shade on the incident radiation. Even the buried contact should be made reflective to photons in accordance with the invention. Similarly any optical concentrators, lenses or the like can be used to focus sunlight, or light from other sources, to the solar cell of the invention, and in particular to the incidence side of the first solar cell 200 in accordance with the invention of which just one example is shown in FIG. 2C.

It should be noted that the embodiment 21 can be freely combined and permuted with embodiments 10, 20, 22, 23, 30, 40 and/or 50 earlier and later in the text in accordance with the invention.

FIG. 2C shows the embodiment 22 with the focusing means 190 and the entrapping reflectors 180, 181 on the sunlight incident side. The photons are typically focused to the depletion region, and there may be a dispersing reflector 195 at the bottom of the first solar cell layer 200, to ensure the reflected photons do not reflect out of the solar cell through the aperture they came in from.

FIG. 2C also shows a single unidirectional filter 100 between the said solar cell layers 200, 201, which is a useful embodiment of the invention.

It should be noted that the embodiment 22 can be freely combined and permuted with embodiments 10, 21, 23, 30, 40 and/or 50 earlier and later in the text in accordance with the invention.

FIG. 2D shows the simplest embodiment of the invention 23, which however places the hardest criteria on the materials chosen. In this embodiment, the filter 100 is realised purely by the interface 100 between the two solar cell layers 200, 201, which have their band gaps and refractive indices selected as describer earlier.

It should be noted that the embodiment 23 can be freely combined and permuted with embodiments 10, 21, 22, 30, 40 and/or 50 earlier and later in the text in accordance with the invention.

Figure 3:
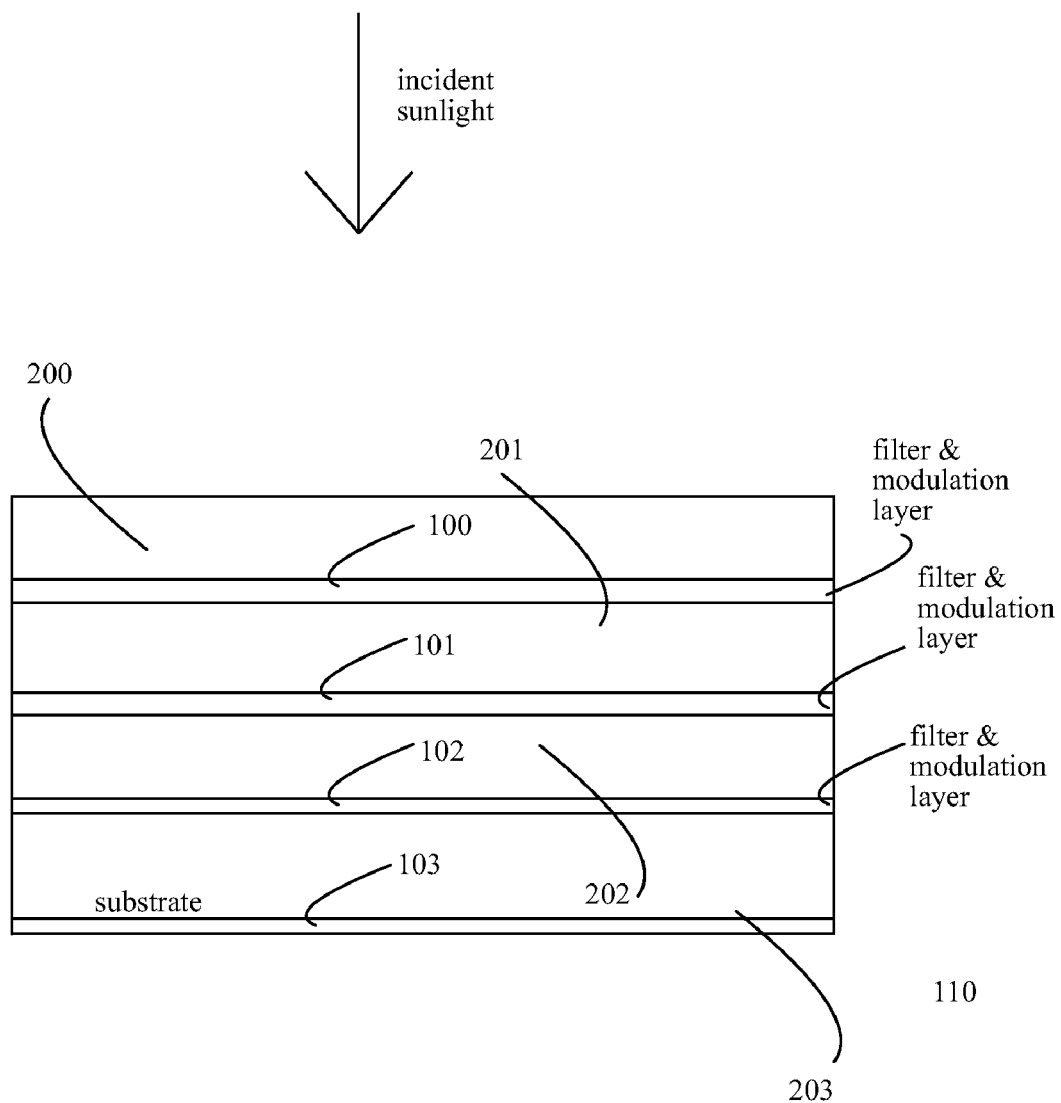
FIG. 3 demonstrates an embodiment 30 of an inventive tandem solar cell with four solar cell layers as a block diagram 30.

FIG. 3 demonstrates an embodiment of the invention where there are four solar cell layers 200, 201, 202, and 203 and three or four photon filters 100, 101, 102 and 103. It should be realised that one of the key inventive concepts of the invention is to get each solar cell layer to work at the band where they have high quantum efficiency (QE) with as many photons of that said energy band as possible, and move photons not at that energy band to another solar cell layer that has a better QE at the energy band of these moved photons. Therefore the QE-wavelength profile of a solar cell layer is of significance to how many solar cell layers are implemented in the design. Typically for semiconductor junctions, the narrower the band is around the optimum energy, the higher the quantum efficiency. When the incoming band comprises photons with an energy that is only slightly larger than the band gap, nearly all energy in the photons will be photoelectrically converted leading to high efficiencies.

In one embodiment of the invention 30 the tandem solar cell comprises several solar cell layers 200, 201, 202, 203, and in between two solar cell layers there is a photon filter, 100, 101, 102. The photon filters are tuned so, that they will trap only those photons that are at an energy where the solar cell layer is working at a good quantum efficiency (QE), ideally close to 1. The rest of the photons are simply passed to the next layer by the photon filter. The solar cell layers 200, 201, 202 are preferably very thin, or otherwise designed so that there is minimal interaction between the solar cell and the photon population at energies where the quantum efficiency is NOT that good, i.e. far from unity. In some embodiments the last solar cell layer, i.e. 203 in this case, can be thick. It may also have a reflective mirror on the side opposite to the incident side of sunlight, or a photon filter 103 that may be designed to let heat photons out, but trap those photons with photovoltaic band gap absorption potential, i.e. energy enough to be absorbed.

In one preferable embodiment of the invention the first solar cell layer 200 is a GaN layer with a band gap of 3.4 eV (electron volt). The second solar cell layer 201 is an InGaP layer with a band gap of 1.93 eV in some embodiments of the invention. The third solar cell layer 202 is a polycrystalline silicon layer, with a band gap at 1.1 eV in some embodiments of the invention. In some further embodiments of the invention the last solar cell layer 203 is an InSb layer with a band gap of 0.17 eV. What could be the cut-off wavelengths $\lambda_x$s? In the layer 200 photons with less than 3.4 eV are useless, as they cannot be absorbed into photocurrent. Therefore the $\lambda_{x100}$ should be equivalent to 3.4 eV or similar, i.e. 365 nm, i.e. a UV-mirror that would let photons longer than 365 nm (nm=nanometers) pass through. Consequently, the second InGaP solar cell layer 201 at 1.93 eV would require the $\lambda_{x101}$ to be equivalent to 1.93 eV or similar, i.e. 643 nm, i.e. a visible light-mirror that would let photons longer than 643 nm pass through. The third polymorphic silicon solar cell layer 202 at 1.1 eV would require 1128 nm for the $\lambda_{x102}$, i.e. a red-IR mirror. The photons longer than 1128 nm or similar threshold would be passed to the fourth layer 203 with an InSb band gap of 0.17 eV→7301 nm In some embodiments of the invention this last layer 203 would be made thick, because all the remaining photons should interact in this layer 203.

In some embodiments of the invention it is preferable to make the solar cell system thin. In some embodiments of the invention the thickness of each solar cell layer is a reasonable multiplier of the wavelength that equates with the band gap, to ensure particle nature of the photons in the solar cell layers. For example if the multiplier were 10, solar cell layers 200, 201, 202 and 203 would have thicknesses of 3650 nm, 6430 nm, 11280 nm and 73010 nm respectively. The one quarter wavelength antireflective coatings would have thicknesses of roughly 91.25 nm, 160.75 nm, 282 nm, 1825 nm, respectively in preferred embodiments of the invention. Assuming the filters have comparative thicknesses the structure would be about one millimeteR thick in accordance with this embodiment of the invention. Naturally these parameters can be tuned in accordance with the invention. Clearly the four layer tandem solar cell is a preferable embodiment, because it samples both the solar spectrum and the resultant secondary spectrum (emerging spectrum after the first solar cell layer), tertiary spectrum (emerging spectrum after the second solar cell layer) and quaternary spectrum (emerging spectrum after the third solar cell layer) so well.

It should be noted that the embodiment 30 can be freely combined and permuted with embodiments 10, 20, 21, 22, 23, 40 and/or 50 earlier and later in the text in accordance with the invention.

Figure 4:
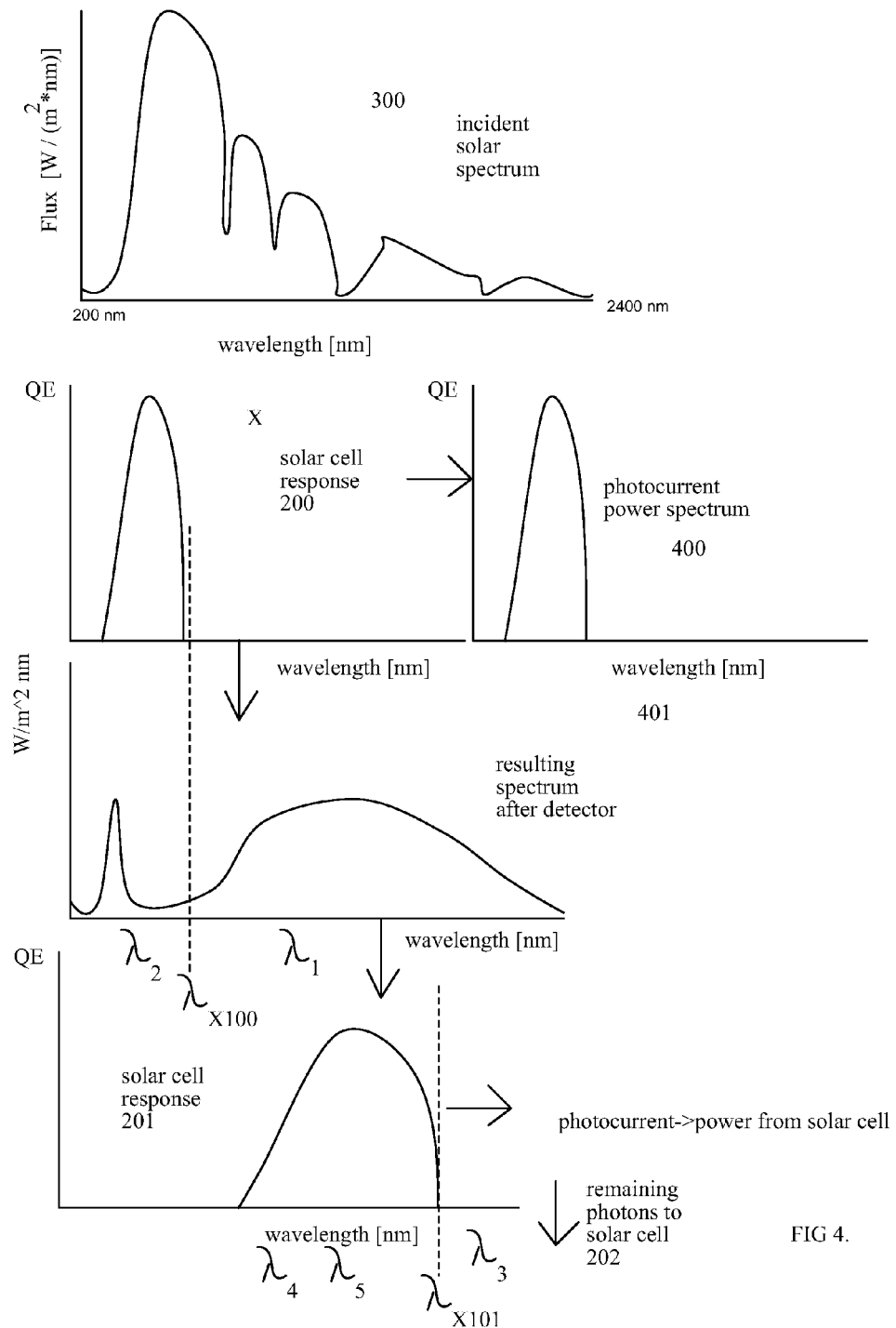
FIG. 4 demonstrates an embodiment 40 of the operation of the inventive tandem solar cell in terms of spectra, i.e. in the energy-wavelength space.

FIG. 4 displays an exemplary embodiment of the invention in energy space—i.e. spectral space. The incident solar spectrum 300 runs from 200 nm in the UV to roughly 2400 nm, the spectrum 300 is a AM 1.5 G 1000 W/m$^2$ solar spectrum typically encountered on Earth. The first solar cell layer 200 has a solar cell response that is slightly lower in energy than the GaN and slightly higher in energy than the InGaP. It has a reasonably high QE in between 365-645 nm, i.e. blue light, as shown in the QE plot that is superposed underneath the spectrum 300. Because the solar cell response practically coincides with the big bump of strong intensity in the incident spectrum 300, the photocurrent power spectrum that shows spectral distribution of collected photocurrent power spectrum 400 and therefore energy and power generated by the first solar cell layer 200 is quite similar in shape to the response of the first solar cell layer 200. However the photon spectrum 401 will be quite modified when it reaches the first photon filter 100. The photon filter 100 will spatiospectrally modulate the photon spectrum 401 in some embodiments of the invention, or use another unidirectional filter as explained before. The photon filter 100 will preferably reflect the $\lambda_2$ photons with higher energies and shorter wavelengths, i.e. the photons with a shorter wavelength of $\lambda_{x100}$ that should correspond to the energy band gap of the solar cell layer 200 in accordance with the invention. The $\lambda_1$ photons will be passed to the second solar cell layer 201 by the focusing means or other spatial modulation means, resulting into the spatial component of the modulation, or by another unidirectional filter, and this layer will again have a different cut-off $\lambda_{x101}$ in accordance with the invention in some embodiments.

The solar cell response 201 converts the photocurrent from this photon population. The photon filter 101 will reflect $\lambda_4$ photons back to the solar cell layer 201, and the reflector that does this resides on the side facing in the same direction as the sunlight incident side. The photon filter 100 will have a reflector 150 around the small apertures 140 that released the $\lambda_1$ photons into the second layer 201, or another reflecting filter 170 or interface on the solar incident side facing the second solar cell layer as explained before. This reflector will reflect $\lambda_5$ photons back again from the side opposite to the sunlight incident side of photon filter 100, resulting in photon entrapment between photon filters 100, 101, for photons that can interact with the band gap of the second solar cell layer. Even though the photon filters would be unidirectional, it is probable under practical conditions that they cannot achieve a completely ideal unidirectional filtration result: with spatiospectral modulation small photon leakage will occur through the improbable incidence of returning photons to apertures, in refractive index structures some stray angle photons may remain, at which incidence angle a small group of photons might be able to violate unidirectionality even when they are at an energy where they should be entrapped to the solar cell layer that they are currently at.

The remaining low energy photons $\lambda_3$ are passed onto a third solar cell layer 202 in accordance with the invention in some embodiments, or they are simply released out of the tandem solar cell or left in the lattice in some embodiments of the invention.

It should be noted that the embodiment 40 can be freely combined and permuted with embodiments 10, 20, 21, 22, 23, 30 and/or 50 earlier and later in the text in accordance with the invention.

Figure 5:
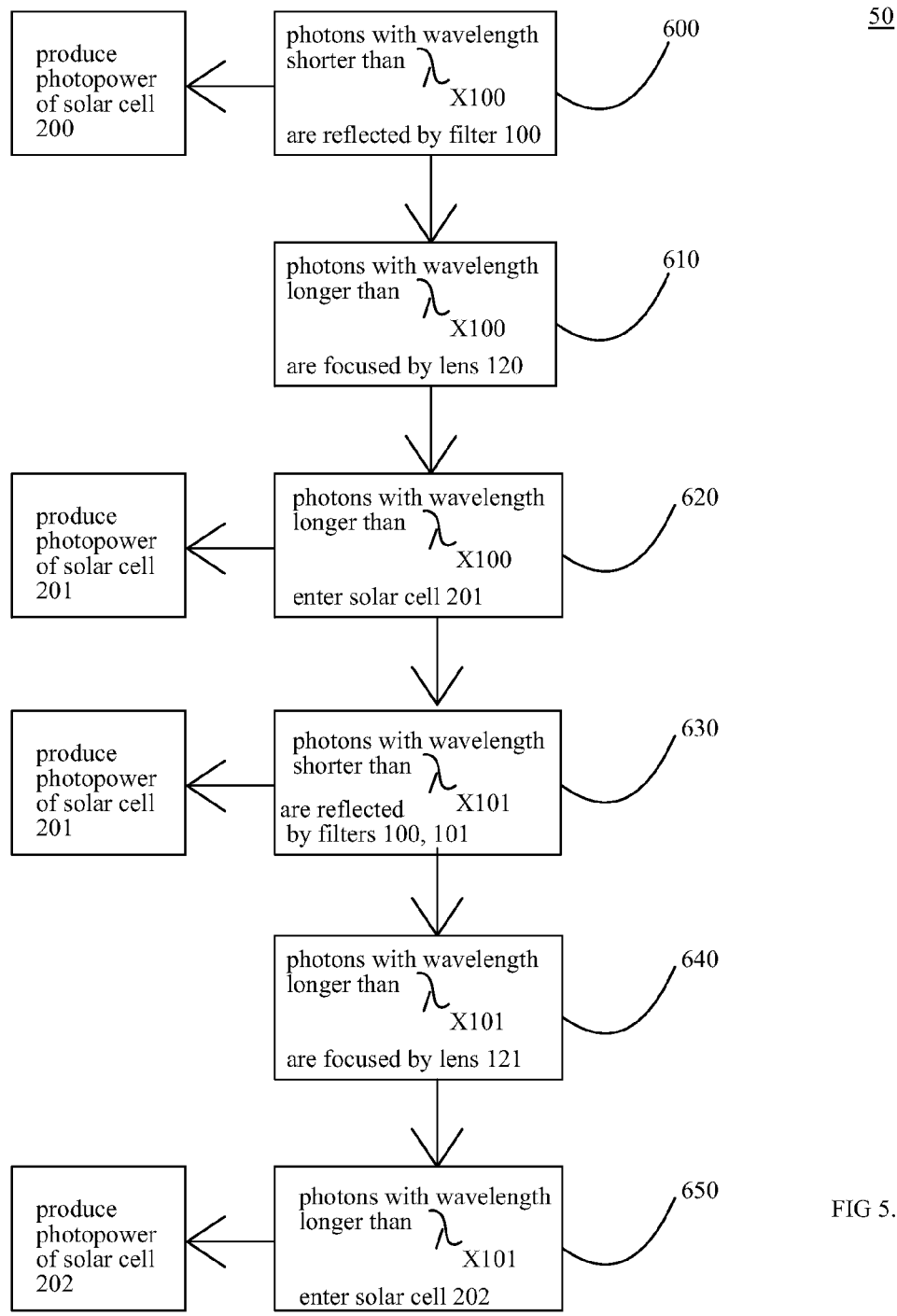
FIG. 5 demonstrates an embodiment 50 of the operation of the inventive tandem solar cell as a flow diagram.

FIG. 5 shows an embodiment of the operation of the inventive method and device as a flow diagram 50. We start to observe the situation after the photons have entered the first solar cell layer 200. Once in the first solar cell layer 200 the photon population traverses through it, with some photons getting absorbed and exciting photocurrent in this solar cell layer. After the photons have traversed through the first solar cell layer 200 that is preferably quite thin, they reach the photon filter 100 in phase 600 where the photons with wavelength shorter than $\lambda_{x100}$ are reflected back to the first solar cell layer 200. The incident and the reflected photons produce the photopower of solar cell 200.

In phase 610 the photons with wavelength longer than $\lambda_{x100}$ are focused by the at least one lens 120. The lenses can be of any shape and any material in accordance with the invention, but they can also be replaced by any other focusing means, or in fact by any means capable of splitting the photon populations in the desired way, for example by a unidirectional filter. The whole point about focusing the photons passed through is to perform the spatial aspect of the modulation in order to achieve enough reflective surface to the other wall of the photon filter 100 facing the second solar cell layer 201.

It is in accordance with the invention to deploy other equivalent means to focusing and spatial modulation in some embodiments. For example and alternatively photons with wavelength longer than $\lambda_{x100}$ may pass to an antireflective coating or coarse interface as explained in FIG. 2B in some embodiments, or they may pass to an interface with refractive indices adjusted to ensure photon selection and entrapment as shown in FIG. 2D and explained before or to a unidirectional filter 100 as shown in FIG. 2C and explained before.

In phase 620 photons with wavelength longer than $\lambda_{x100}$ enter the solar cell 201 through at least one aperture 140, which are typically very small in order to maximise the reflective area 150 of the other wall of the photon filter 100 facing the second solar cell layer 201. Some of these incident photons now generate photopower from second solar cell layer 201. In phase 630 the photons with wavelength shorter than $\lambda_{x101}$ are reflected by the photon filter 101. These photons are thus simply reflected back to the second solar cell layer 201. Some of these reflected photons are absorbed and produce photopower of solar cell 201.

Some of the reflected photons pass through the second solar cell layer 201 again, without having been absorbed. Provided their wavelength is shorter than $\lambda_{x101}$ these photons are reflected again, this time by the reflector 150 of photon filter 100. In some embodiments of the invention the reflector 150 of the photon filter on the wall facing the second solar cell layer 201 is designed to simply reflect back all the photons or as many photons as possible on as wide a band as possible in accordance with the invention. In phase 630 there will now be a photon population bouncing back and forth between the photon filters 100, 101 in accordance with the invention. This photon entrapment gives several opportunities for the photons to get absorbed into the second solar cell layer 201. In phase 640 the photons that no longer have a chance of being converted to photocurrent, are focused by the lens 121 or other focusing means. It makes sense to adjust the cut off $\lambda_{x101}$ so that it reflects back all those photons that do have a chance of getting absorbed in the second solar cell layer 201, but naturally $\lambda_{x101}$ can be selected otherwise in accordance with the invention, based on other design criteria for example.

In phase 650 the photons with wavelength longer than $\lambda_{x101}$ enter the solar cell 202 preferably from small apertures 141 in the wall of the photon filter 101 facing the third solar cell layer 202. The process repeats in the third solar cell layer 202 with the same aforementioned principle albeit at longer wavelengths to generate the photopower of the solar cell 202.

It should be noted that the embodiment 50 can be freely combined and permuted with embodiments 10, 20, 21, 22, 23, 30 and/or 40 earlier in the text in accordance with the invention.

The operation of the method 50 was explained with spatiospectral modulation providing the unidirectional filtering of photons. It is in accordance with the invention to use the other unidirectional photon filters described earlier to realise the operation of the embodiment 50 mutatis mutandis.

It should also be noted that in all or some embodiments in addition to inter band gap semiconductors, also intra band gap semiconductor junctions, such as quantum cascade semiconductor junctions can be used to achieve the desired photoelectric properties for a particular solar cell layer in accordance with the invention. It should also furthermore be noted that the solar cells of the invention need not be necessarily square or flat, indeed they can be realised in any shape, for example spherical shape in some embodiments, as described in FI20070743 Thermodynamically shielded solar cell & counterparts or otherwise. Furthermore it should be stressed that in some embodiments of the invention the solar cell or tandem solar cell systems of the invention can be realised in any size, from nanometer scale structures to large structures. From power plant size installations to power solutions of very small portable devices, the solar cells and the photon filtration systems find use in many markets in accordance with the invention.

It should also be noted that the invention has been described here so that the highest band gap solar cell and the highest band pass filter is the first incident to the sunlight.

It should be noted that the invention can also be implemented in the reverse order, i.e. having the smaller energy solar cell layers and filters first in some embodiments. Indeed the band gaps of the solar cell layers may be in any order in some embodiments of the invention, the main point is that these solar cell layers work with photons that are at an energy at which the solar cell layer has a good QE, and DO NOT work with photons that are at an energy where the QE is poor.

However, the highest band gap material first and the conduction of the filtering and band gaps in an order of high-to-low when moving from the incident sunlight side to the back of the tandem solar cell is preferable in some embodiments of the invention, because this produces the smallest number of photoelectric absorptions per the first photoelectric unit of energy generated. In layman terms, the bigger energy photons absorbing themselves first create more energy in a lesser number of absorptions, because the absorptions are of higher energy. This leads to smaller number of second order photons and phonons generated, and we do want to avoid small energy photons, especially if their energy is so small that we are pushed to find a small enough band gap in the consecutive solar cell layers. However, when starting from the low band gap material first, a huge number of absorptions can occur, but at a low unit energy per absorption. The higher energy photons will in this case be producing a lot of secondary photons, and the spectrum will "cool", i.e. move to lower E photons considerably faster. Once these photons start to approach energies we can no longer photo electrically collect, they begin to be parasitic and thus not preferred.

It should be noted that the embodiments described here can be used in any combination or permutation with any of the embodiments described in the other patent applications of the inventor FI20070264 An active solar cell and method of manufacture, FI20070743 Thermodynamically shielded solar cell, FI20070801 Method and means for designing a solar cell and EP 09154530.1 Low cost solar cell and/or their international counterparts which are now explicitly incorporated into this application.

For example the use of the bias voltage as described in FI20070264 is preferable in especially the lower solar cell layers in some embodiments of the invention to achieve photoelectric conversion at very low band gaps. For example the optical concentration and convective, conductive and/or radiative shielding solutions of FI20070743 can be implemented in a very useful way to ensure high photon fluxes in accordance with the invention in some embodiments. Likewise the software design method of FI20070801 can be used to design some of the tandem cells in accordance with the invention. Some of the cost reducing embodiments of EP 09154530.1, or other embodiments, can be combined with the embodiments of the present invention. Many useful embodiments can thus be derived from combining the embodiments of these five patent applications from the same inventor that are all directed to the same theme: providing a photoelectric solution to the global energy problem.

It should be noted that the electrodes collecting photocurrent from the aforementioned solar cell layers may be arranged in any configuration in accordance with the invention. Furthermore the position and/or angle of the p-n junction to the incident solar flux or artificial light may be arranged to any position and/or angle and the system of the invention can be implemented in any geometry.

It is currently not known, which are all the factors that cause a shortcoming in the efficiency of the solar cell. However, based on the studies of the applicant, the general tandem solar cell is hampered the most by the photon phonon processes that take place outside the band of maximum quantum efficiency of the solar cell. The inventive concept presented in this application, i.e. the filtering of the photon population so that all layers of a tandem solar cell work at their optimum quantum efficiencies (QEs) will greatly improve the efficiency of and power generated by solar cells. The unidirectionality of the inventive photon filters realises this advantage as the leakage of unwanted photons back to earlier solar cell layers is minimised.

The aforementioned invention has a multitude of practical use scenarios. The solar cells of the invention can be installed to a power plant for power generation to the grid. The inventions can be installed on any building to provide electricity for air conditioning and household appliances, or the like in that building or elsewhere. The inventive solar cells can be installed on a vehicle, to power the vehicle motor electrically, charge the battery, or power electric appliances for the vehicle. However, as the inventive solar cells have a reasonably high cost of design and manufacture at first, the most advantageous application is probably in the field of portable electronic devices. Laptop computers, mobile phones, electric shavers, epilators, electric toothbrushes, calculators, music players such as MP3 players (e.g. ipod), palm computers, TV's, radios, screens, monitors, printers, flash memory drives, external hard disk drives, watches and/or any other kind of electric equipment that now needs a charger can be installed with the solar cells of the invention. As the solar cells of the invention are very efficient producing high power per unit area, the solar cells can keep the battery of the device charged pretty much all the time, without increasing the dimensions of the portable device. A further notable advantage of the invention is that it converts electric power very efficiently from artificial light also. In one advantageous embodiment at least one solar cell layer of the tandem solar cell is chosen arranged so that it has a band gap and a spectral response that converts electricity efficiently from photons emitted by indoor lights, such as fluorescent lights, LEDs (light emitting diodes) or light bulbs. The solar cell layers of the invention can also be arranged to work well in both indoor and outdoor solar light, by choosing the solar cell layer materials with the appropriate spectral responses and band gaps in accordance with the invention.

Quite clearly the solar cells of the invention can be camouflaged to aesthetically fit any product or building. Also, quite clearly the solar cells of the invention can be coupled with other power generation mechanism, such as kinetic power generation by piezoelectric crystals or the like to increase the battery time of the portable electronic device, or even to get rid of the need for a grid charger in some embodiments of the invention.

In fact a power system including both a solar cell arranged to generate power by photoelectric conversion (from sunlight and indoor lights) and a piezoelectric crystal arranged to generate power from its mechanical movement (for example by the person using and carrying the power system) is in itself an invention. It could be used to realise new devices with considerably longer battery times, or new portable devices even without the restriction of grid charging. The combination of a mechanical and photovoltaic power source is especially preferable because the photovoltaic power generation works when the portable device is exposed to light, and the piezoelectric and/or other mechanical power generation system based on e.g. (pendulum and/or springs found in watches) works typically when the portable electronic device is concealed in the pocket of the user, i.e. being moved in the dark. This way the inventive system is charging the portable electronic device nearly all the time. Especially in one embodiment the combined power system of a mechanical power generator and a solar cell will feature a solar cell with a band gap at an energy associated with photons emitted from fluorescent lights or other indoor lightning systems, typically at a wavelength of 400-500 nm.

The inventive tandem solar cell would suit the above mentioned power solution for a portable device perfectly, as it can cope with a variety of incoming light spectra, such as indoor light spectra in some embodiments.

The invention has been explained above with reference to the aforementioned embodiments and several commercial and industrial advantages have been demonstrated. The methods and arrangements of the invention allow the construction of a solar cell where a high number of very thin solar cell layers each work at nearly 100% quantum efficiency, because the inventive photon filters restrict the photon population to the most efficient bands of the solar cell layers, and therefore a practically ideal solar cell delivering power close to the solar constant 1.37 kW/m$^2$ in space and roughly 1 kW/m$^2$ on Earth is made possible by the invention.

The invention has been explained above with reference to the aforementioned embodiments. However, it is clear that the invention is not only restricted to these embodiments, but comprises all possible embodiments within the spirit and scope of the inventive thought and the following patent claims.

REFERENCES

FI20070264 An active solar cell and method of manufacture
FI20070743 Thermodynamically shielded solar cell
FI20070801 Method and means for designing a solar cell
EP 09154530.1 Low cost solar cell
EP 1724 841 A1, Josuke Nakata, "Multilayer Solar Cell"
U.S. Pat. No. 6,320,117, James P. Campbell et al., "Transparent solar cell and method of fabrication"
U.S. Pat. No. 6,689,949, Ugur Ortabasi, Concentrating photovoltaic cavity converters for extreme solar-to-electric conversion efficiencies.
US 2008/0251112 A1, David g. Jenkins, Concentrating photovoltaic kaleidoscope and method.
Solar Electricity, Thomas Markvart, 2$^{nd}$ Edition, ISBN 0-471-98852-9
"An unexpected discovery could yield a full spectrum solar cell, Paul Preuss, Research News, Lawrence Berkeley National Laboratory.
U.S. Pat. No. 5,021,100, Takashi Ishihara et al. Tandem Solar Cell.

The invention claimed is:

1. A tandem solar cell, comprising:
   at least two layers of solar cells, a first layer and a second layer stacked upon one another in a light incident direction,
   a photon filter arranged in between the first solar cell layer and the second solar cell layer, the photon filter comprising a reflecting cover (110) on a light incident side, means for focusing disposed underneath the reflective cover and a photon reflector (150) on a side opposite the light incident side,
   the first solar cell layer arranged with the photon filter on a side opposite to the light incident side,
   the photon filter arranged to reflect photons of certain energies ($\lambda_2$) back into the first solar cell layer,
   the photon filter arranged to be transparent to photons of other energies ($\lambda_1$) not arranged to be reflected, and these photons arranged to enter the second solar cell layer,
   wherein the photon filter focuses said photons of other energies ($\lambda_1$), and the said photons enter through small apertures embedded in the photon reflector (150) from the photon filter side opposite to the light incident side, said side opposite to the light incident side being a photon reflector (150).

2. The tandem solar cell as claimed in claim 1, wherein said certain energies ($\lambda_2$) are energies where the first solar cell layer has higher quantum efficiency (QE) than the second solar cell layer, and/or the said other energies ($\lambda_1$) are energies where the second solar cell layer has higher quantum efficiency (QE) than the first solar cell layer.

3. The tandem solar cell as claimed in claim 1, wherein the photon filter is at least one of a dielectric stack or a Rugate filter.

4. The tandem solar cell as claimed in claim 1, wherein the photon filter is a first photon filter, and the second solar cell layer is arranged with a second photon filter on the side opposite to the incident side of light.

5. The tandem solar cell as claimed in claim 4, wherein the second photon filter is arranged to be transparent to photons that are not at energies where the second solar cell layer has a high quantum efficiency (QE), said transparent photons are arranged to enter a third solar cell layer.

6. The tandem solar cell as claimed in claim 1, wherein the reflecting cover is a Rugate filter or an optical band pass filter.

7. The tandem solar cell as claimed in claim 1, wherein underneath the reflecting cover is at least one means for focusing photons that are not reflected through the reflecting cover.

8. The tandem solar cell as claimed in claim 7, wherein the at least one means for focusing focus a photon population into a narrowing horn.

9. The tandem solar cell as claimed in claim 8, wherein the narrowing horn is covered with reflecting material so that the photons that pass through are directed out of at least one of said small apertures.

10. The tandem solar cell as claimed in claim 7, wherein the means for focusing focus the photons to a small spot when the photons exit the filter.

11. The tandem solar cell as claimed in claim 1, wherein underneath the reflecting cover is at least one lens configured for focusing photons that are not reflected through the reflecting cover.

12. The tandem solar cell as claimed in claim 11, wherein the at least one lens focus a photon population into a narrowing horn.

13. The tandem solar cell as claimed in claim 12, wherein the narrowing horn is covered with reflecting material so that the photons that pass through are directed out of at least one of said small apertures.

14. The tandem solar cell as claimed in claim 11, wherein the at least one lens focus the photons to a small spot when the photons exit the filter.

* * * * *